(12) United States Patent
Kizaki et al.

(10) Patent No.: US 8,212,458 B2
(45) Date of Patent: Jul. 3, 2012

(54) FLEXURAL-MODE TUNING-FORK TYPE QUARTZ CRYSTAL RESONATOR

(75) Inventors: Shigeru Kizaki, Tokyo (JP); Ryota Kawai, Tokyo (JP); Kazuyoshi Kawakita, Tokyo (JP); Yoshiji Matsui, Tokyo (JP); Shinichi Morishima, Tokyo (JP)

(73) Assignee: Kyocera Kinseki Corporation, Tokyo (JP)

( * ) Notice: Subject to any disclaimer, the term of this patent is extended or adjusted under 35 U.S.C. 154(b) by 218 days.

(21) Appl. No.: 12/825,164

(22) Filed: Jun. 28, 2010

(65) Prior Publication Data

US 2010/0327707 A1    Dec. 30, 2010

(30) Foreign Application Priority Data

Jun. 30, 2009    (JP) ................... 2009-156389

(51) Int. Cl.
*H03H 9/215*    (2006.01)
*H01L 41/18*    (2006.01)
(52) U.S. Cl. ........................ 310/370; 310/371
(58) Field of Classification Search .................. 310/361, 310/370
See application file for complete search history.

(56) References Cited

U.S. PATENT DOCUMENTS

2001/0054860 A1 * 12/2001 Knowles ........................ 310/370
2009/0255338 A1 * 10/2009 Watanabe ................... 73/504.16

FOREIGN PATENT DOCUMENTS

| JP | S51-138076 U |   | 11/1976 |
| JP | 2003-198303 A | * | 7/2003 |
| JP | 2008-301297 A |   | 12/2008 |

* cited by examiner

*Primary Examiner* — Thomas M Dougherty
(74) *Attorney, Agent, or Firm* — Blakely, Sokoloff, Taylor & Zafman

(57) ABSTRACT

A flexural-mode tuning-fork type quartz crystal resonator includes a proximal portion, a pair of vibrating arm portions, and a plurality of first concave portions. The vibrating arm portions project in a direction from the proximal portion. The first concave portions are formed into groove shapes in the upper and lower principal surfaces of the proximal portion, and extend in the widthwise direction perpendicular to the longitudinal direction of the pair of vibrating arm portions. The first concave portions formed in the upper principal surface of the proximal portion and those formed in the lower principal surface of the proximal portion are arranged at a predetermined interval not to face each other.

6 Claims, 4 Drawing Sheets

RELATED ART

US 8,212,458 B2

FLEXURAL-MODE TUNING-FORK TYPE QUARTZ CRYSTAL RESONATOR

BACKGROUND OF THE INVENTION

The present invention relates to a flexural-mode tuning-fork type quartz crystal resonator used in an electronic device.

Conventionally, an electronic device such as a computer, cellular phone, or compact information device includes a piezoelectric vibrator or piezoelectric oscillator as an electronic component. The piezoelectric vibrator or piezoelectric oscillator is used as a reference signal source or clock signal source. In addition, the piezoelectric vibrator or piezoelectric oscillator incorporates a flexural-mode tuning-fork type quartz crystal resonator made of crystal.

Japanese Patent Laid-Open No. 2008-301297 discloses a conventional flexural-mode tuning-fork type quartz crystal resonator using crystal as a piezoelectric material. This related art will be described with reference to FIGS. 6 and 7.

A conventional flexural-mode tuning-fork type quartz crystal resonator 400 includes a piezoelectric chip 410, excitation electrodes 421a, 421b, 422a, and 422b, frequency adjusting metal films 424a and 424b, connection electrodes 423a and 423b, and leading wiring patterns 425 and 426.

As shown in FIG. 7, the piezoelectric chip 410 includes a flat proximal portion 411 having an almost rectangular shape when viewed from the upper side, and a pair of vibrating arm portions 412 projecting in the same direction from one side of the proximal portion 411. The pair of vibrating arm portions 412 include a first vibrating arm portion 412a and a second vibrating arm portion 412b.

As shown in FIG. 6, the excitation electrodes 421a are provided on the upper and lower principal surfaces of the first vibrating arm portion 412a opposed to each other. Note that the "upper and lower principal surfaces" are the two surfaces of the proximal portion 411 which have the largest surface areas and are parallel to each other, and also include surfaces directed in the same direction as that of the two surfaces. Surfaces that are visible in FIGS. 6 and 7 are "upper surfaces", and hidden surfaces are "lower surfaces". The definitions of "upper and lower principal surfaces", "upper surfaces", and "lower surfaces" also apply to the description of the embodiments and FIGS. 1, 2, 4, and 5.

The excitation electrodes 421b are provided on the two side surfaces of the first vibrating arm portion 412a opposed to each other. The excitation electrodes 422a are provided on the upper and lower principal surfaces of the second vibrating arm portion 412b opposed to each other. The excitation electrodes 422b are provided on the two side surfaces of the second vibrating arm portion 412b opposed to each other.

Note that the excitation electrodes 421b provided on the two side surfaces of the first vibrating arm portion 412a are electrically connected by the frequency adjusting metal films 424a. The excitation electrodes 422b provided on the two side surfaces of the second vibrating arm portion 412b are electrically connected by the frequency adjusting metal films 424b.

The connection electrodes 423a are provided on the upper and lower principal surfaces of the proximal portion 411 on a side close to the first vibrating arm portion 412a. The connection electrodes 423a are electrically connected to the excitation electrodes 421b, as well. The connection electrodes 423a are electrically connected to the excitation electrodes 422a of the second vibrating arm portion 412b via the excitation electrodes 421b by the leading wiring patterns 426 provided on the principal surfaces of the proximal portion 411.

The connection electrodes 423b are provided on the upper and lower principal surfaces of the proximal portion 411 on a side close to the second vibrating arm portion 412b. The connection electrodes 423b are electrically connected to the excitation electrodes 421a as well by the leading wiring patterns 425 provided on the principal surfaces of the proximal portion 411. The connection electrodes 423a are electrically connected to the excitation electrodes 422b of the second vibrating arm portion 412b.

The frequency adjusting metal films 424a are provided at the distal end portions of the upper principal surface and the side surfaces of the first vibrating arm portion 412a, and electrically connected to the excitation electrodes 421b provided on the two side surfaces of the first vibrating arm portion 412a. The frequency adjusting metal films 424b are provided at the distal end portions of the upper principal surface and the side surfaces of the second vibrating arm portion 412b, and electrically connected to the excitation electrodes 422b provided on the two side surfaces of the second vibrating arm portion 412b.

In the flexural-mode tuning-fork type quartz crystal resonator 400, when an alternating voltage is applied to the connection electrodes 423a and 423b, electric fields of opposite polarities are generated on the first vibrating arm portion 412a and the second vibrating arm portion 412b. The first vibrating arm portion 412a and the second vibrating arm portion 412b expand and contract so as to generate a vibration.

However, if the vibration leaks from the vibrating arm portions 412 to the proximal portion 411, the temperature characteristic and CI (Crystal Impedance) value of the flexural-mode tuning-fork type quartz crystal resonator 400 degrade.

Japanese Utility Model Laid-Open No. 51-138076 proposes a technique of forming, in the principal surfaces of the proximal portion 411, shallow groove-shaped concave portions extending in the widthwise direction, i.e., the direction perpendicular to the direction of the vibrating arm portions 412 projecting form the proximal portion 411 so as to attenuate the vibration leaked from the vibrating arm portions 412 and prevent the vibration from propagating.

However, the flexural-mode tuning-fork type quartz crystal resonator having no support arm portions as part of constitute elements cannot sufficiently attenuate the vibration leaked from the vibrating arm portions 412 even when the shallow groove-shaped concave portions extending in the widthwise direction of the proximal portion 411 are formed. It is therefore impossible to sufficiently suppress degradation in the temperature characteristic or CI value.

SUMMARY OF THE INVENTION

It is an object of the present invention to solve this problem and provide a flexural-mode tuning-fork type quartz crystal resonator which attenuates a vibration from vibrating arm portions.

According to the present invention, there is provided a flexural-mode tuning-fork type quartz crystal resonator comprising a proximal portion, a pair of vibrating arm portions which project in a direction from the proximal portion, and a plurality of first concave portions which are formed into groove shapes in upper and lower principal surfaces of the proximal portion, and extend in a widthwise direction perpendicular to a longitudinal direction of the pair of vibrating arm portions, wherein the first concave portions formed in the upper principal surface of the proximal portion and the first concave portions formed in the lower principal surface of the proximal portion are arranged at a predetermined interval not to face each other.

DESCRIPTION OF THE PREFERRED EMBODIMENTS

Figure 1:
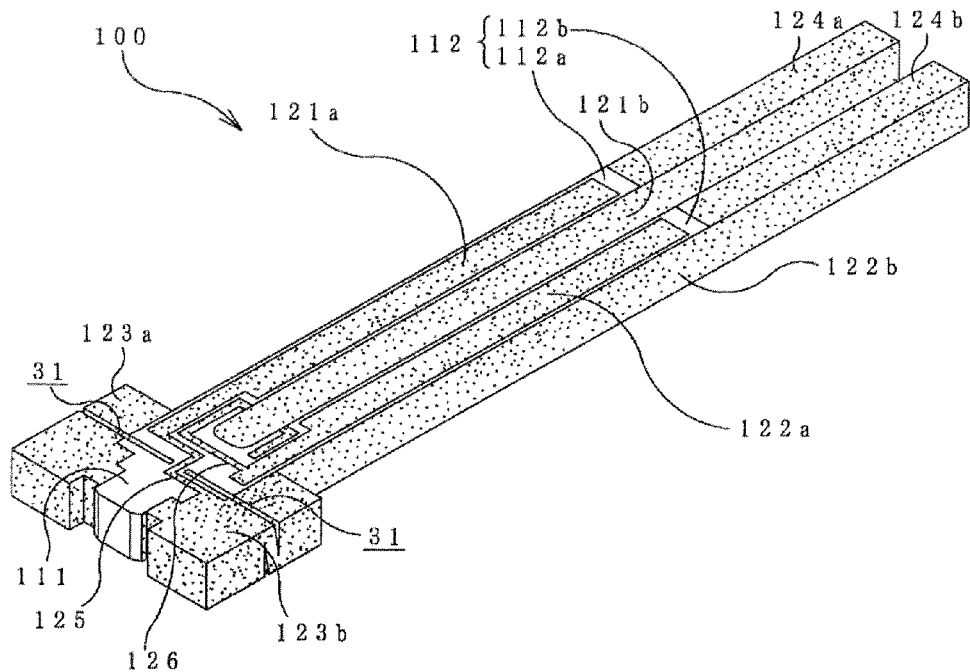
FIG. 1 is a perspective view showing a flexural-mode tuning-fork type quartz crystal resonator according to the first embodiment of the present invention.

The best mode for carrying out the present invention (to be referred to as "embodiments" hereinafter) will now be described in detail with reference to the accompanying drawings. Note that the elements of each embodiment are exaggeratedly illustrated for the sake of easy understanding of the state.

(First Embodiment)

The structure of a flexural-mode tuning-fork type quartz crystal resonator 100 according to the first embodiment of the present invention will be described with reference to FIGS. 1 and 2.

The flexural-mode tuning-fork type quartz crystal resonator 100 includes a piezoelectric chip 110a, excitation electrodes 121a, 121b, 122a, and 122b, connection electrodes 123a and 123b, frequency adjusting metal films 124a and 124b, and leading wiring patterns 125 and 126. The excitation electrodes 121a, 121b, 122a, and 122b, connection electrodes 123a and 123b, frequency adjusting metal films 124a and 124b, and leading wiring patterns 125 and 126 are provided on the surfaces of the piezoelectric chip 110a.

Figure 2:
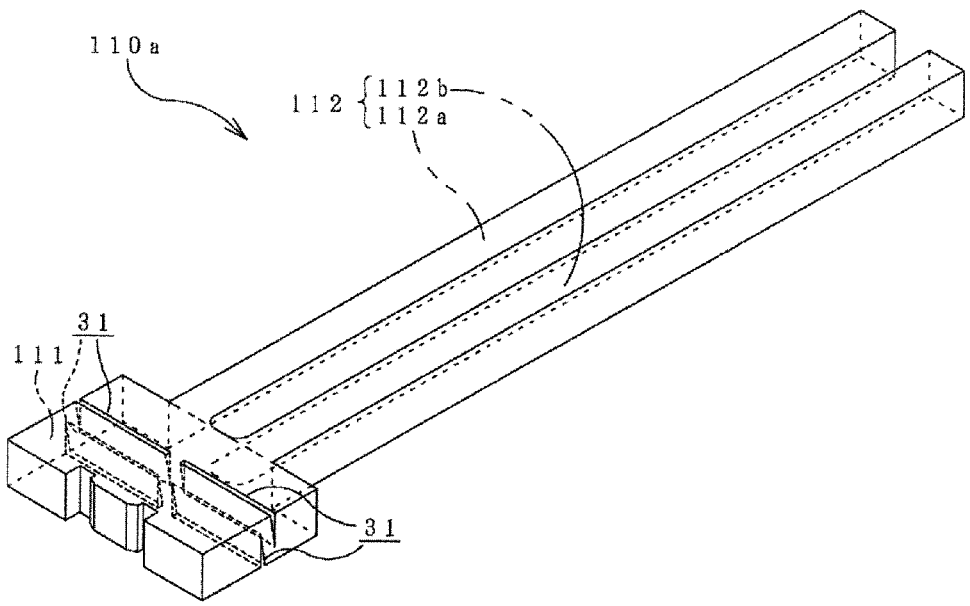
FIG. 2 is a perspective view showing a piezoelectric chip used in the flexural-mode tuning-fork type quartz crystal resonator shown in FIG. 1.

As shown in FIG. 2, the piezoelectric chip 110a is made of, for example, crystal, and includes a flat proximal portion 111 having an almost rectangular shape when viewed from the upper side, and a pair of vibrating arm portions 112 projecting in the same direction from one side of the proximal portion 111. The pair of vibrating arm portions 112 include a first vibrating arm portion 112a and a second vibrating arm portion 112b. The piezoelectric chip 110a is formed by integrating the proximal portion 111, first vibrating arm portion 112a, and second vibrating arm portion 112b.

The proximal portion 111 includes a plurality of first concave portions 31 extending in the widthwise direction. A direction perpendicular to the direction in which the first vibrating arm portion 112a and the second vibrating arm portion 112b project from the proximal portion 111, i.e., the longitudinal direction of the first vibrating arm portion 112a and the second vibrating arm portion 112b will be defined as the "widthwise direction" here.

As shown in FIG. 1, the excitation electrodes 121a are provided on the upper and lower principal surfaces of the first vibrating arm portion 112a. The excitation electrodes 121b are provided on the two side surfaces of the first vibrating arm portion 112a opposed to each other.

The frequency adjusting metal films 124a are provided at the distal end portions of the upper principal surface and the two side surfaces of the first vibrating arm portion 112a, and electrically connected to the excitation electrodes 121b provided on the two side surfaces of the first vibrating arm portion 112a.

The connection electrodes 123a are provided on the upper and lower principal surfaces of the proximal portion 111 on the side of the first vibrating arm portion 112a.

The excitation electrodes 122a are provided on the upper and lower principal surfaces of the second vibrating arm portion 112b. The excitation electrodes 122b are provided on the two side surfaces of the second vibrating arm portion 112b opposed to each other.

The frequency adjusting metal films 124b are provided at the distal end portions of the upper principal surface and the side surfaces of the second vibrating arm portion 112b, and electrically connected to the excitation electrodes 122b provided on the two side surfaces of the second vibrating arm portion 112b.

The connection electrodes 123b are provided on the upper and lower principal surfaces of the proximal portion 111 on the side of the second vibrating arm portion 112b.

Note that the connection electrodes 123a and 123b are provided on the upper and lower principal surfaces of the proximal portion 111 while being shifted not to be rendered conductive.

It is possible to adjust the oscillation frequency value of the flexural-mode tuning-fork type quartz crystal resonator 100 to a desired value by increasing or decreasing the metal amount of the frequency adjusting metal films 124a and 124b.

As shown in FIG. 1, the connection electrodes 123b are electrically connected to the excitation electrodes 121a by the leading wiring patterns 125 provided on the upper and lower principal surfaces of the proximal portion 111. The connection electrodes 123b are also electrically connected to the excitation electrodes 122b and the frequency adjusting metal films 124b. Hence, the excitation electrodes 121a and 122b, the frequency adjusting metal films 124b, and the connection electrodes 123b are electrically connected via the leading wiring patterns 125 provided on the surfaces of the piezoelectric chip 110a.

The connection electrodes 123a are electrically connected to the excitation electrodes 121b and the frequency adjusting metal films 124a. The excitation electrodes 121b are electrically connected to the excitation electrodes 122a by the leading wiring patterns 126 provided on the upper and lower principal surfaces of the proximal portion 111. Hence, the excitation electrodes 121b and 122a, the frequency adjusting metal films 124a, and the connection electrodes 123a are electrically connected by the leading wiring patterns 126 provided on the surfaces of the piezoelectric chip 110a.

Each of the excitation electrodes 121a, 121b, 122a, and 122b, connection electrodes 123a and 123b, frequency adjusting metal films 124a and 124b, and leading wiring patterns 125 and 126 is formed from a Cr layer serving as an underlying metal layer and an Au layer stacked on the underlying metal layer. The excitation electrodes, connection electrodes, frequency adjusting metal films, and leading wiring patterns can be formed on the surfaces of the piezoelectric chip 110a by deposition and photolithography.

To vibrate the flexural-mode tuning-fork type quartz crystal resonator 100 having the above-described structure, an alternating voltage is applied to the connection electrodes 123a and 123b. In an instantaneous electrical state after application, the excitation electrodes 121b of the first vibrating arm portion 112a are set at a + (positive) potential, and the excitation electrodes 121a are set at a − (negative) potential so that an electric field is generated from + to −. On the other hand, the excitation electrodes 122a and 122b of the second vibrating arm portion 112b have polarities opposite to those of the excitation electrodes 121a and 121b of the first vibrating arm portion 112a. Due to the applied electric fields, expansion and contraction occur in the first vibrating arm portion 112a and the second vibrating arm portion 112b. A flexure vibration at the resonance frequency set in the vibrating arm portions 112 is thus obtained.

A piezoelectric vibrator is formed by placing the flexural-mode tuning-fork type quartz crystal resonator 100 in a case. For example, the case has a concave portion with an opening in one principal surface. An element connection electrode pad is formed on the bottom surface of the concave portion. The flexural-mode tuning-fork type quartz crystal resonator 100 is placed on the pad. Then, the opening of the concave portion is hermetically sealed by a lid, thereby forming a piezoelectric vibrator.

The first concave portions 31 will be described next in more detail.

The first concave portions 31 are formed into groove shapes in the upper and lower principal surfaces of the proximal portion 111. The first concave portions 31 formed in the upper principal surface of the proximal portion 111 and those formed in the lower principal surface of the proximal portion 111 are arranged at a predetermined interval not to face each other. In FIG. 2, the first concave portions 31 formed in on upper principal surface side of the proximal portion 111 are arranged on a side closer to the first vibrating arm portion 112a and the second vibrating arm portion 112b than those formed on the lower principal surface side. However, the positions may be reversed.

The first concave portions 31 are formed at positions far apart from a position where a conductive adhesive to be used for mounting is applied. For example, when the conductive adhesive is applied to an end portion of the proximal portion 111 (an end portion on the opposite side of the vibrating arm portions 112), the first concave portions 31 are provided at positions far apart from the end portion of the proximal portion 111 and closer to the side of the vibrating arm portions 112 than the intermediate portion.

The first concave portions 31 provided on the upper and lower principal surfaces of the proximal portion 111 are formed widthwise across the proximal portion 111 while leaving portions where the leading wiring patterns 125 are provided in the widthwise direction. Referring to FIG. 2, the first concave portions 31 break at the central portions of the principal surfaces of the proximal portion 111. The leading wiring patterns 125 are formed at the portions where the first concave portions 31 break. Note that the width of each first concave portion 31 is preferably shorter than ½ the width of the proximal portion 111 and longer than the width of the first vibrating arm portion 112a or the second vibrating arm portion 112b.

The first concave portion 31 can be formed so as to have, for example, a U-shaped or V-shaped section, or a sectional shape with a wall surface that changes the tilt angle.

Figure 3:
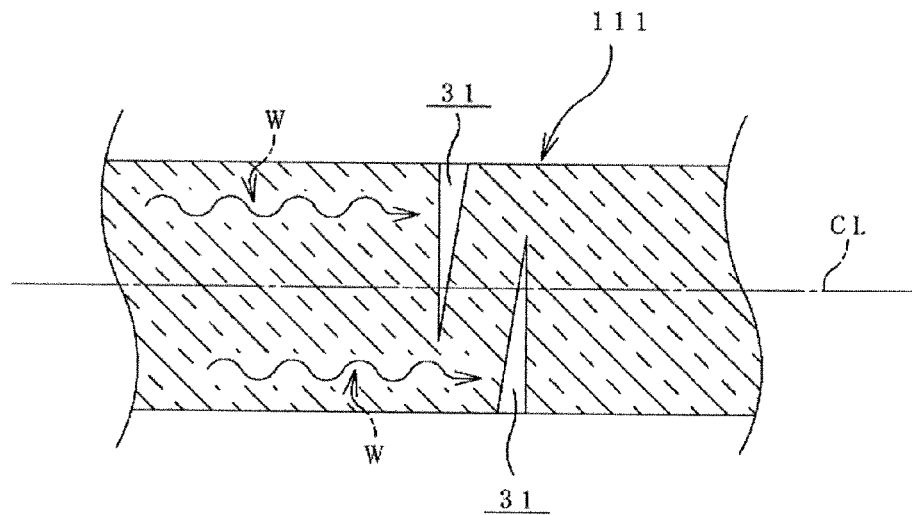
FIG. 3 is a conceptual view for explaining the function of first concave portions.

Each of the first concave portions 31 has a depth larger than ½ the thickness of the proximal portion 111. More specifically, as shown in FIG. 3, each of the first concave portions 31 is formed to a depth exceeding a center line CL of the thickness of the proximal portion 111. More specifically, the depth of each of the first concave portions 31 is larger than 50% of the thickness of the proximal portion 111 but smaller than 90%.

If the depth of each of the first concave portions 31 is equal to or smaller than 50%, a vibration W which is leaked from the first vibrating arm portion 112a and the second vibrating arm portion 112b and propagates through the proximal portion 111 passes through the first concave portions 31. The vibration W leaks, and the CI value can hardly be improved. On the other hand, if the depth of each of the first concave portions 31 is equal to or larger than 90%, the proximal portion 111 cannot ensure its strength, and may break halfway during the manufacture.

The flexural-mode tuning-fork type quartz crystal resonator 100 has the first concave portions 31 in the upper and lower principal surfaces of the proximal portion 111. For this reason, the vibration W propagating through the upper principal surface of the proximal portion 111 is attenuated by the first concave portions 31 on the upper principal surface side, and the vibration W propagating through the lower principal surface of the proximal portion 111 is attenuated by the first concave portions 31 on the lower principal surface side. Additionally, since the first concave portions 31 are formed from both the upper principal surface and the lower principal surface to the depth exceeding the center line CL of the thickness of the proximal portion 111, the vibration W propagating inside the proximal portion 111 is also attenuated by the first concave portions 31. Hence, the first concave portions 31 can attenuate the vibration W leaked from the vibrating arm portions 112 and thus attenuate the vibration W propagating to the support portion of the proximal portion 111.

The first concave portions 31 of the proximal portion 111 can be formed by wet etching or the like. However, they can easily be formed without considering etching residues.

(Second Embodiment)

Figure 4:
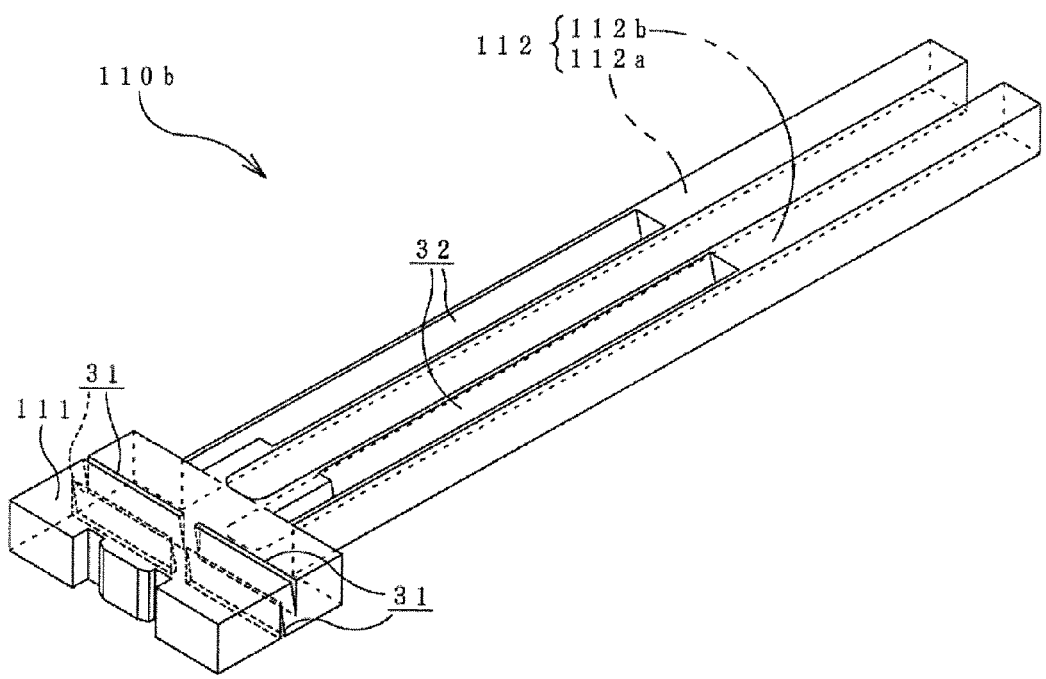
FIG. 4 is a perspective view showing a piezoelectric chip used in a flexural-mode tuning-fork type quartz crystal resonator according to the second embodiment of the present invention.

A flexural-mode tuning-fork type quartz crystal resonator according to the second embodiment of the present invention is designed by forming a second concave portion 32 in each of the first vibrating arm portion 112a and the second vibrating arm portion 112b that are the vibrating arm portions 112 of the piezoelectric chip 110a used in the first embodiment. A piezoelectric chip 110b shown in FIG. 4 will be described as an example.

The piezoelectric chip 110b includes a proximal portion 111, and a first vibrating arm portion 112a and a second vibrating arm portion 112b which project from the proximal portion 111.

First concave portions 31 are formed widthwise in the upper and lower principal surfaces of the proximal portion 111. The first concave portions 31 formed in the upper principal surface and those formed in the lower principal surface of the proximal portion 111 are arranged at a predetermined interval not to face each other.

Each of the first vibrating arm portion 112a and the second vibrating arm portion 112b has one second concave portion 32. The second concave portion 32 extends in the same direction as the projecting direction (the longitudinal direction of the vibrating arm portions 112a and 112b) of the first vibrating arm portion 112a and the second vibrating arm portion 112b which project from the proximal portion. The length of each of the second concave portions 32 is shorter than the length of the first vibrating arm portion 112a or the second vibrating arm portion 112b. Each of the second concave portions 32 is formed into a groove shape having a predetermined depth.

The second concave portions 32 do not have the function of suppressing propagation of a vibration W but have a function of stabilizing the flexure vibration of the first vibrating arm portion 112a and the second vibrating arm portion 112b.

The components other than the second concave portions 32 are the same as those of the flexural-mode tuning-fork type quartz crystal resonator 100 according to the first embodiment, and a description thereof will not be repeated.

Even the arrangement of the flexural-mode tuning-fork type quartz crystal resonator according to the second embodiment can attenuate the vibration W leaked from the vibrating arm portions 112.

(Third Embodiment)

Figure 5:
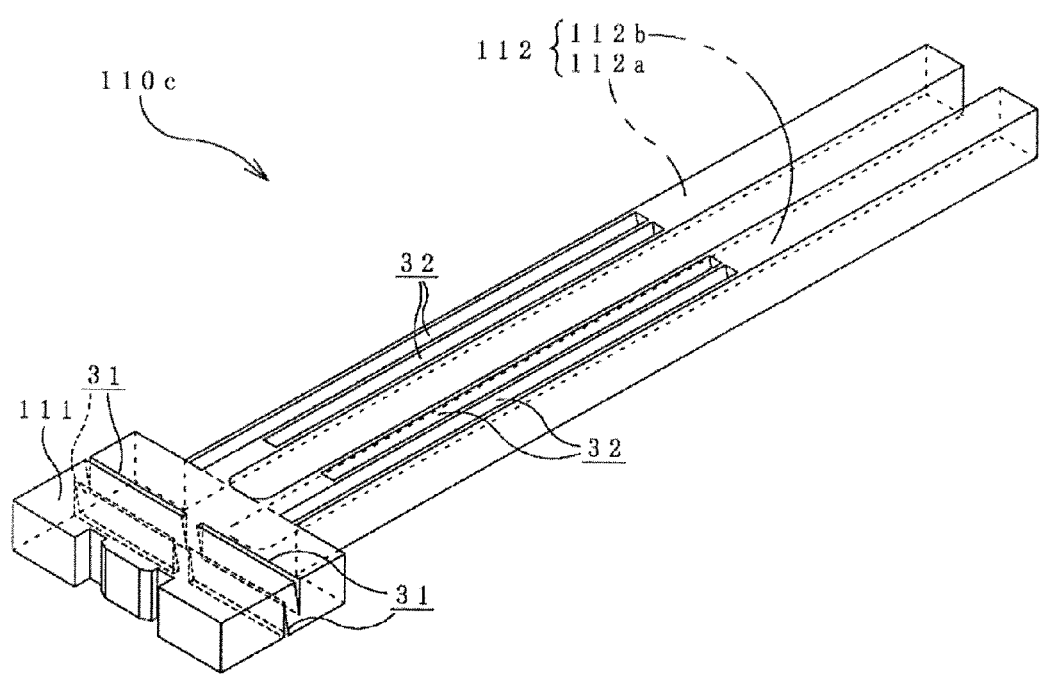
FIG. 5 is a perspective view showing a piezoelectric chip used in a flexural-mode tuning-fork type quartz crystal resonator according to the third embodiment of the present invention.
Figure 6:
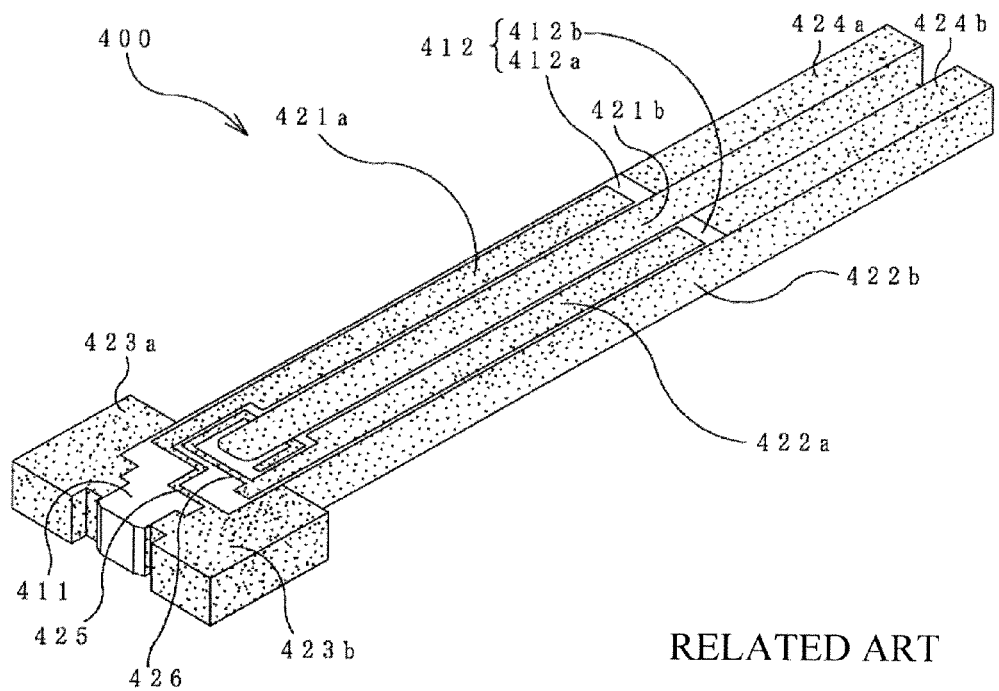
FIG. 6 is a perspective view showing an example of a conventional flexural-mode tuning-fork type quartz crystal resonator.
Figure 7:
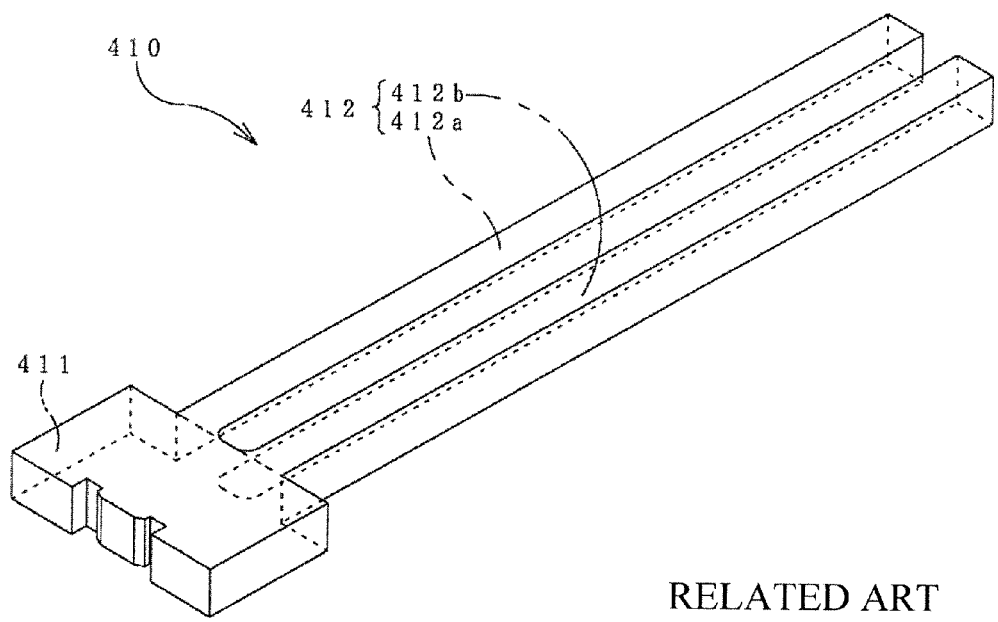
FIG. 7 is a perspective view showing a piezoelectric chip used in the flexural-mode tuning-fork type quartz crystal resonator shown in FIG. 6.

A flexural-mode tuning-fork type quartz crystal resonator according to the second embodiment of the present invention is designed by forming a pair of second concave portions 32 in each of the first vibrating arm portion 112a and the second vibrating arm portion 112b that are the vibrating arm portions 112 of the piezoelectric chip 110a used in the first embodiment. A piezoelectric chip 110c shown in FIG. 5 will be described as an example.

The piezoelectric chip 110c includes a proximal portion 111, and a first vibrating arm portion 112a and a second vibrating arm portion 112b which project from the proximal portion 111.

First concave portions 31 are formed widthwise in the upper and lower principal surfaces of the proximal portion 111. The first concave portions 31 formed in the upper principal surface and those formed in the lower principal surface of the proximal portion 111 are arranged at a predetermined interval not to face each other.

Each of the first vibrating arm portion 112a and the second vibrating arm portion 112b has two second concave portions 32. The two second concave portions 32 are arrayed in the widthwise direction of the first vibrating arm portion 112a and the second vibrating arm portion 112b. The second concave portions 32 extend in the same direction as the projecting direction (the longitudinal direction of the vibrating arm portions 112a and 112b) of the first vibrating arm portion 112a and the second vibrating arm portion 112b which project from the proximal portion. The length of each of the second concave portions 32 is shorter than the length of the first vibrating arm portion 112a or the second vibrating arm portion 112b. Each of the second concave portions 32 is formed into a groove shape having a predetermined depth.

The second concave portions 32 do not have the function of attenuating a propagating vibration W but have a function of stabilizing the flexure vibration of the first vibrating arm portion 112a and the second vibrating arm portion 112b.

The components other than the second concave portions 32 are the same as those of the flexural-mode tuning-fork type quartz crystal resonator 100 according to the first embodiment, and a description thereof will not be repeated.

Even the arrangement of the flexural-mode tuning-fork type quartz crystal resonator according to the third embodiment can attenuate the vibration W leaked from the vibrating arm portions 112.

Note that each of the first vibrating arm portion 112a and the second vibrating arm portion 112b may have three or more second concave portions 32.

The embodiments of the present invention have been described above. However, the present invention is not limited to these, and changes and modifications can be made as needed without departing from the spirit and scope of the present invention.

For example, a plurality of first concave portions 31 may be arrayed widthwise on one principal surface or both principal surfaces.

The shape of the proximal portion 111 can also be changed, as needed. The width of the proximal portion 111 may partially change. For example, even if the proximal portion 111 has different widths on the side of the vibrating arm portions 112 and on the side of the end portion supported by mounting, the same effect as in the first embodiment can be obtained by providing the groove-shaped first concave portions 31 in the widthwise direction of the proximal portion 111.

In addition, the width of the proximal portion 111 may be adjusted in accordance with the outer sides of the vibrating arm portions 112 so that the outer sides of the proximal portion 111 and those of the vibrating arm portions 112 are located on lines.

Such arrangements of the flexural-mode tuning-fork type quartz crystal resonator 100 can also attenuate the vibration W leaked from the vibrating arm portions 112, suppress propagation of the vibration W to the support portion, and suppress degradation in the temperature characteristic or CI value.

The second concave portions 32 may be arrayed in the longitudinal direction of the vibrating arm portions 112.

What is claimed is:

1. A flexural-mode tuning-fork type quartz crystal resonator comprising:
   a proximal portion;
   a pair of vibrating arm portions which project in a direction from the proximal portion; and
   a plurality of first concave portions which are formed into groove shapes in upper and lower principal surfaces of the proximal portion, and extend in a widthwise direction perpendicular to a longitudinal direction of the pair of vibrating arm portions,
   wherein the first concave portions formed in the upper principal surface of the proximal portion and the first concave portions formed in the lower principal surface of the proximal portion are arranged at a predetermined interval not to face each other.

2. A resonator according to claim 1, wherein each of the plurality of first concave portions has a depth more than ½ a thickness of the proximal portion.

3. A resonator according to claim 1, wherein each of the plurality of first concave portions has a depth larger than 50% of a thickness of the proximal portion but smaller than 90%.

4. A resonator according to claim 1, wherein a width of each of the plurality of first concave portions is shorter than ½ a width of the proximal portion and longer than one of the pair of vibrating arm portions.

5. A resonator according to claim 1, wherein each of the pair of vibrating arm portions includes a groove-shaped second concave portion shorter than a length of the vibrating arm portion.

6. A resonator according to claim 1, wherein each of the pair of vibrating arm portions includes not less than two groove-shaped second concave portions each shorter than a length of the vibrating arm portion.

* * * * *